(12) United States Patent
Sun et al.

(10) Patent No.: US 10,822,847 B2
(45) Date of Patent: Nov. 3, 2020

(54) LOCKING DEVICE AND CHASSIS COVER USING THE SAME

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Da-Long Sun, Wuhan (CN); Jun-Zhi Xu, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 329 days.

(21) Appl. No.: 15/983,320

(22) Filed: May 18, 2018

(65) Prior Publication Data

US 2019/0316392 A1    Oct. 17, 2019

(30) Foreign Application Priority Data

Apr. 11, 2018    (CN) .......................... 2018 1 0322139

(51) Int. Cl.
*E05C 9/04* (2006.01)
*E05C 1/12* (2006.01)
*E05B 65/00* (2006.01)
*G06F 1/18* (2006.01)

(52) U.S. Cl.
CPC .............. *E05C 9/04* (2013.01); *E05B 65/006* (2013.01); *E05C 1/12* (2013.01); *G06F 1/181* (2013.01)

(58) Field of Classification Search
CPC ... E05C 9/04; E05C 1/12; E05C 9/043; E05B 65/006; E05B 73/0082; E05B 13/002; G06F 1/181; G06F 1/1656; H05K 5/0221
USPC .......... 49/460, 463, 464, 501, 503; 361/679, 361/679.01, 679.02, 679.31, 679.6, 683, 361/684
See application file for complete search history.

(56) References Cited

U.S. PATENT DOCUMENTS

2004/0196623 A1* 10/2004 Erickson ................. G06F 1/181
361/679.59

* cited by examiner

*Primary Examiner* — Justin V Lewis
(74) *Attorney, Agent, or Firm* — ScienBiziP, P.C.

(57) ABSTRACT

A locking device for a cover of a chassis comprises a first moving lock and a first handle. The first moving lock comprises a hook. The first moving lock slides on the cover. When the first moving lock is moved, the hook is driven to move between a locked position and an unlocked position, so that the cover is secured to or removed from the chassis.

20 Claims, 9 Drawing Sheets

LOCKING DEVICE AND CHASSIS COVER USING THE SAME

FIELD

The subject matter herein generally relates to locking devices of chassis.

BACKGROUND

A computer case usually includes a box and a cover on the side of the box, and the cover is usually fixed on the box by screws. When the cover is removed or fitted, the screws fixing the cover plate must be loosened or fastened one by one, which is quite inconvenient.

BRIEF DESCRIPTION OF THE DRAWINGS

Implementations of the present disclosure will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but may have one or more deviations from a true cylinder. The term "comprising," when utilized, means "including, but not necessarily limited to"; it specifically indicates open-ended inclusion or membership in the so-described combination, group, series, and the like.

Figure 1:
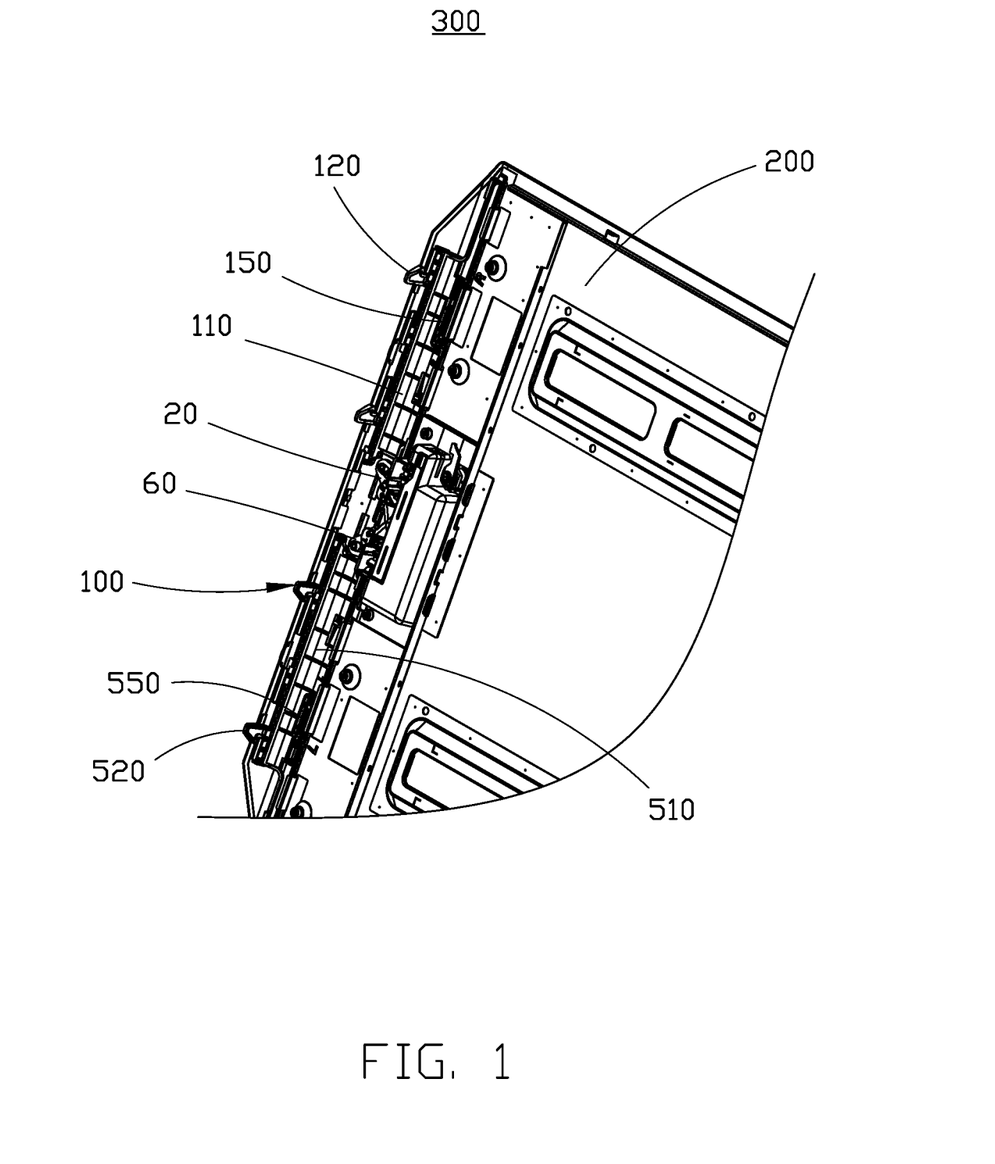
FIG. 1 is a partial view of an exemplary embodiment of an assembled chassis cover, which includes a locking device.
Figure 2:
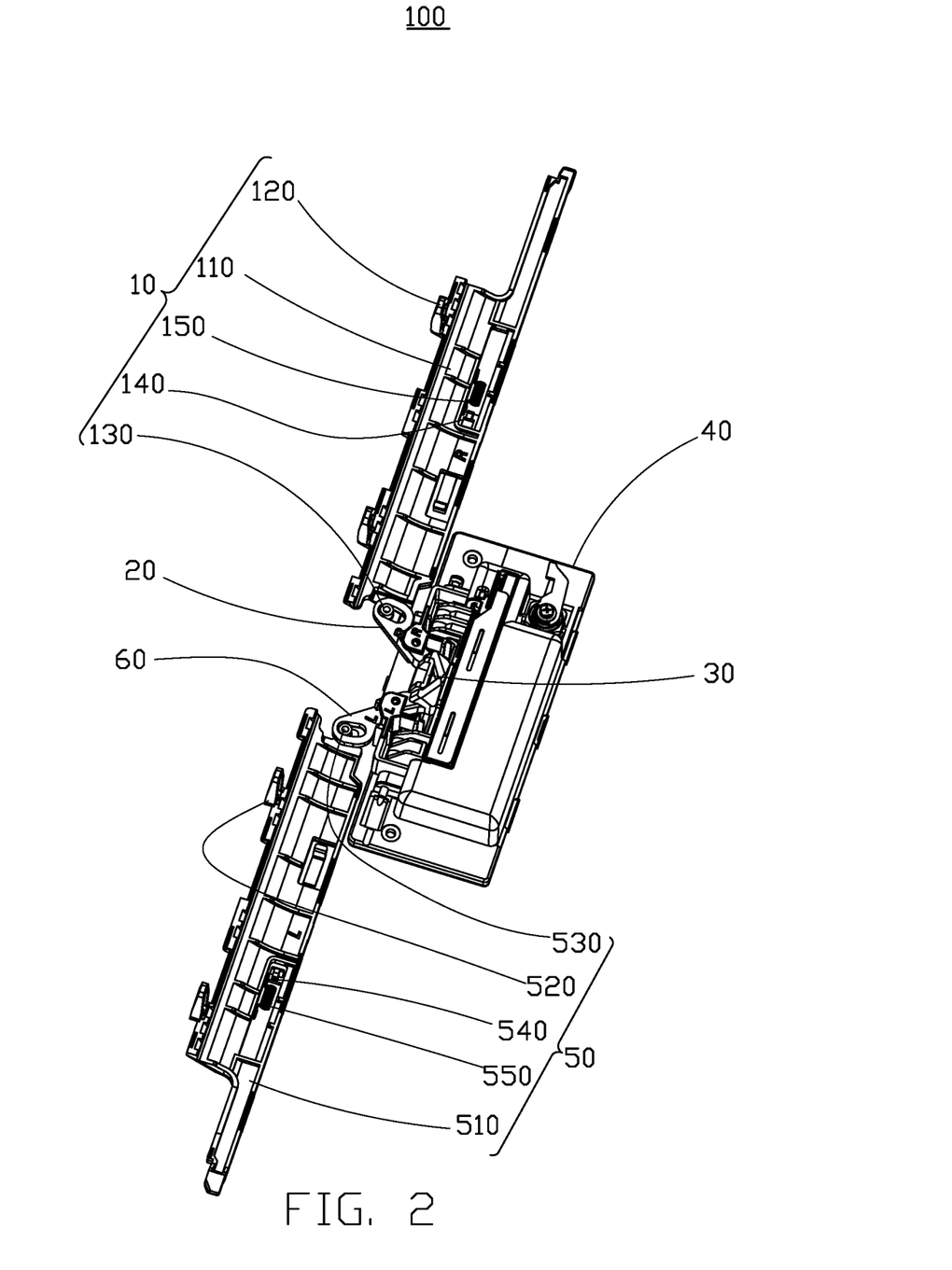
FIG. 2 is a view of the assembled locking device of FIG. 1.

FIG. 1 illustrates a chassis cover 300 in an exemplary embodiment. The chassis cover 300 may comprise a cover body 200 and a locking device 100. The locking device 100 may be installed in the cover body 200, and the cover body 200 may be locked to or unlocked from a chassis (not shown in figures) by the locking device 100.

With further reference to FIGS. 2-6, the locking device 100 may comprise a first moving lock 10, a linking rod 20, a first handle 30, and a fixing board 40.

The first moving lock 10 may comprise a hook 120. The first moving lock 10 may slide on the cover body 200.

When the first moving lock 10 is moved, the first moving lock 10 may drive the hook 120 to move between a locked position and an unlocked position, so that the chassis cover 300 can be fitted to or removed from the chassis.

When the first moving lock 10 drives the hook 120 to the locked position, the hook 120 can be locked at a predetermined position on the chassis, and the chassis cover 300 is thus fixed to the chassis.

When the first moving lock 10 drives the hook 120 to the unlocked position, the hook 120 can be separated from the chassis. Thus, the chassis cover 300 can be separated from the chassis.

The first handle 30 is rotatably connected to the fixing board 40. The first handle 30 may comprise a first driving portion 330.

A first end of the linking rod 20 is hinged to one end of the first moving lock 10, and a second end of the linking rod 20 is connected to the first driving portion 330. When the first handle 30 is turned, the first driving portion 330 may drive the linking rod 20 to move, and the linking rod 20 drives the first moving lock 10 to move.

The cover body 200 may define a guiding slot (not shown in figures), and the guiding slot matches with the first moving lock 10. The guiding slot may guide the movement of the first moving lock 10.

In at least one exemplary embodiment, the first moving lock 10 may further comprise a first moving portion 110. The hook 120 protrudes from the side of the first moving portion 110. The linking rod 20 may drive the first moving portion 110 to move between the locked and the unlocked positions.

In at least one exemplary embodiment, the first moving lock 10 may further comprise a first sliding portion 130. The first end of the linking rod 20 defines a first sliding slot 210, and the first sliding slot 210 matches with the first sliding portion 130. The first end of the linking rod 20 is hinged to the first moving portion 110 through the first sliding portion 130 and the first sliding slot 210.

The linking rod 20 may further comprise a first connecting portion 220 and a first hinging portion 230. A first end of the first connecting portion 220 defines the first sliding slot 210, and a second end of the first connecting portion 220 is connected to the first hinging portion 230. The first hinging portion 230 may match with the first driving portion 330.

When the first handle 30 is turned, the first driving portion 330 may drive the first hinging portion 230 to move, and the first hinging portion 230 drives the linking rod 20 to move.

The extending direction of the first sliding slot 210 is substantially perpendicular to the moving direction of the first moving lock 10. Thus, when the first driving portion 330 drives the linking rod 20 to move, the first sliding portion 130 may slide along the first sliding slot 210, and the first moving lock 10 may travel along the first sliding slot 210.

In at least one exemplary embodiment, the first moving lock 10 may further comprise an elastic element 150. The elastic element 150 connects between the first moving portion 110 and an external component (not shown in figures).

When the first handle 30 is turned, the first moving portion 110 moves toward to the unlocking position, and the elastic element 150 is elastically deformed. When the first handle 30 is released, the elastic element 150 restores itself and drives the first moving portion 110 to return to the locked position. Thus, the chassis cover 300 can be locked in place, and when the first handle 30 is turned, the chassis cover 300 can be unlocked.

The first moving portion 110 may comprise a first fixing portion 140. The elastic element 150 connects between the first fixing portion 140 and the external component.

Figure 4:
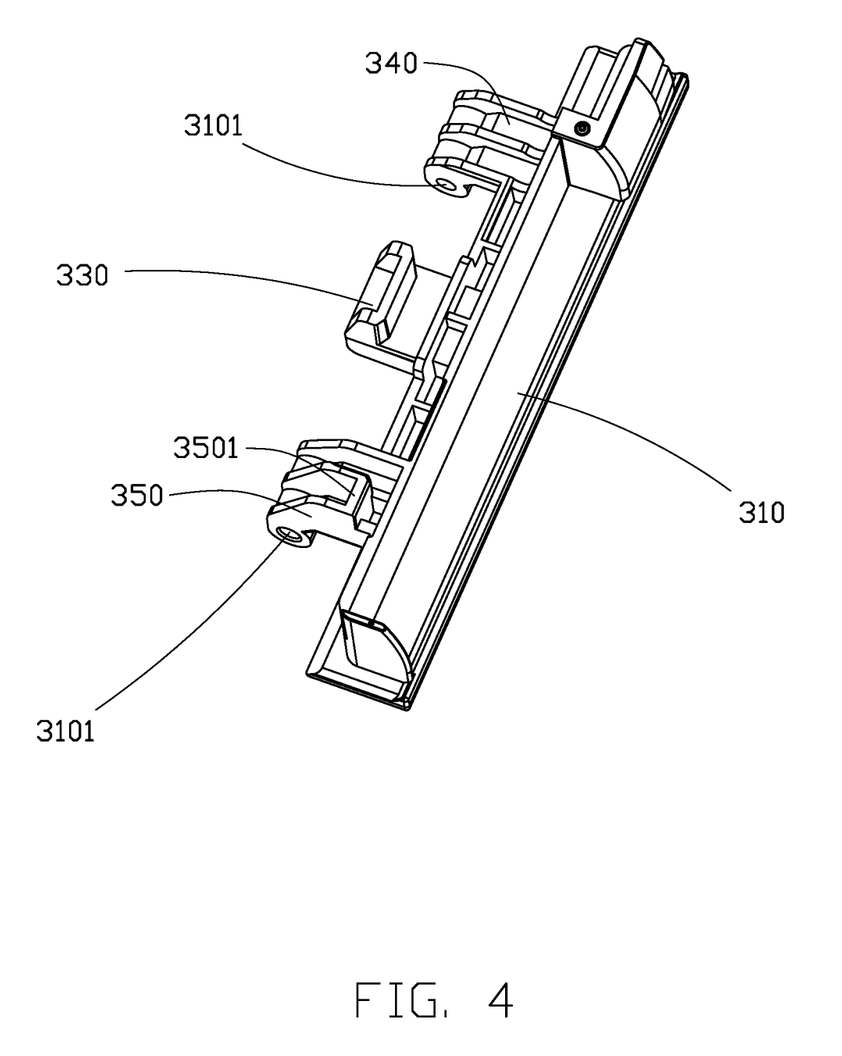
FIG. 4 is an isometric view of a first handle of the locking device of FIG. 2.
Figure 5:
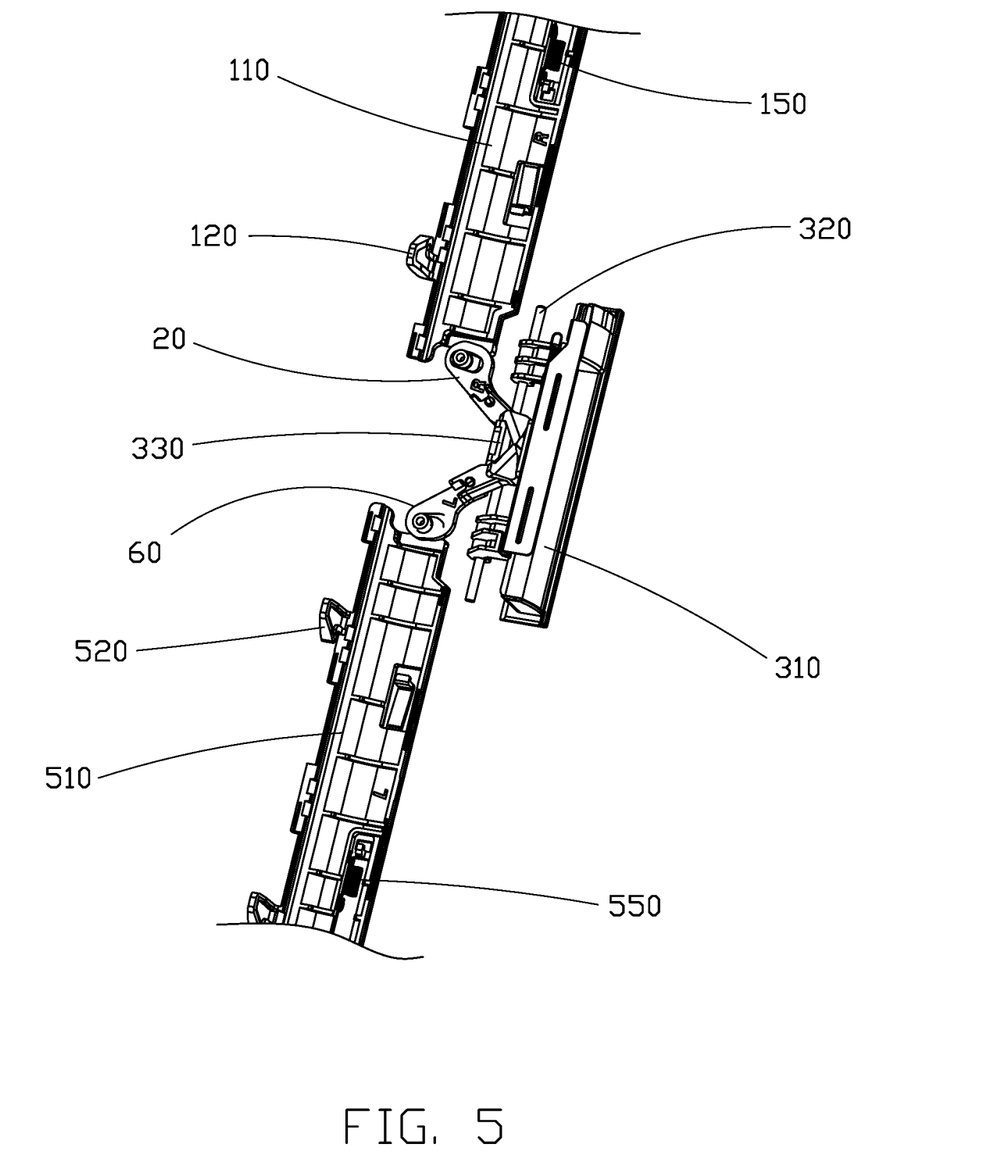
FIG. 5 is an isometric view of the locking device of FIG. 2 when locked.
Figure 6:
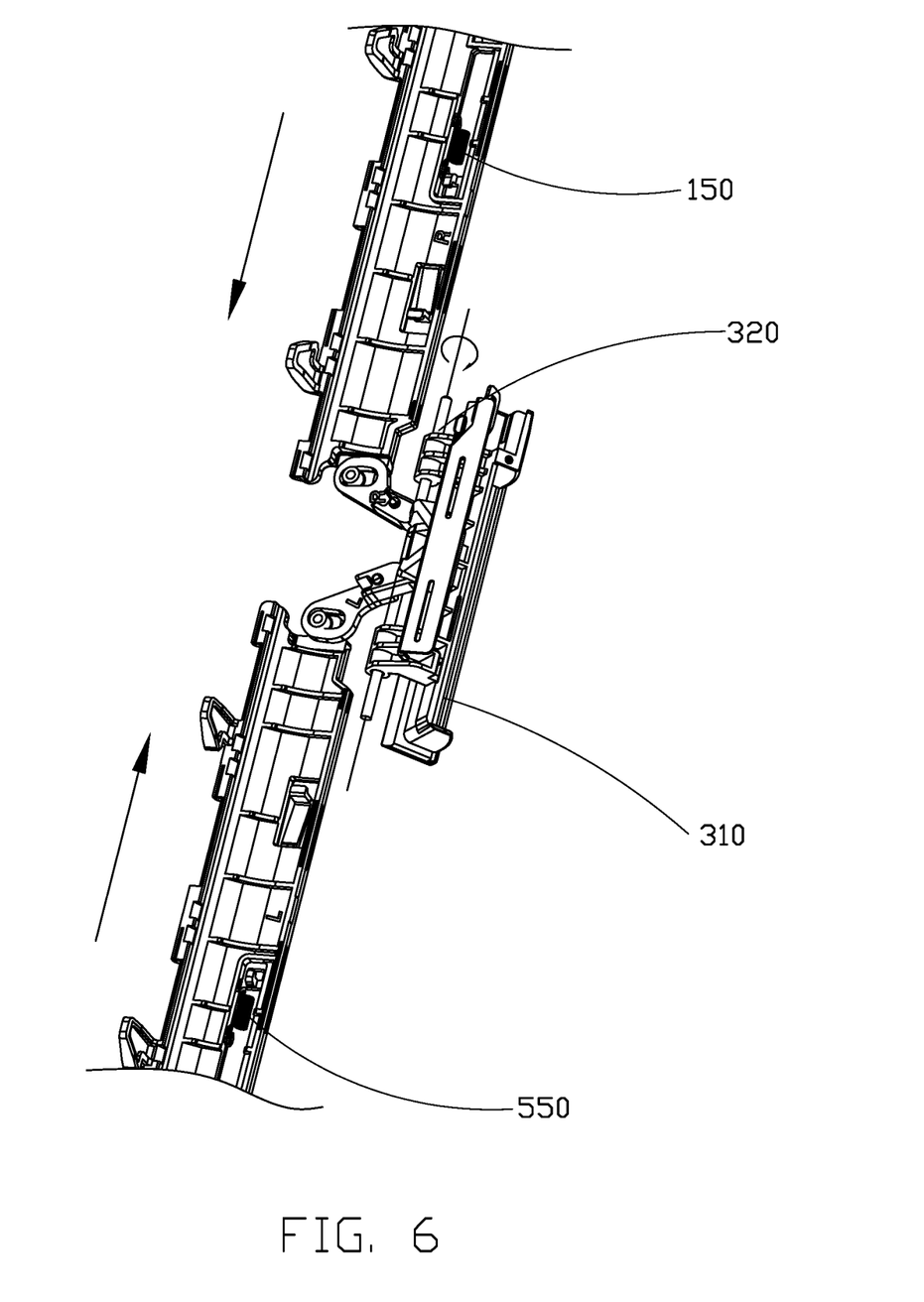
FIG. 6 is an isometric view of the locking device of FIG. 2 in an unlocked state.

In at least one exemplary embodiment, the first handle 30 may further comprise a handing portion 310, a pivoting axis 320, a first rotating portion 340, and a second rotating portion 350. The first driving portion 330 is located between the first rotating portion 340 and the second rotating portion 350. Both the first rotating portion 340 and the second rotating portion 350 define a first shaft hole 3101, and the first shaft hole 3101 matches with the pivoting axis 320. The second rotating portion 350 may comprise a pressing portion 3501.

Figure 3:
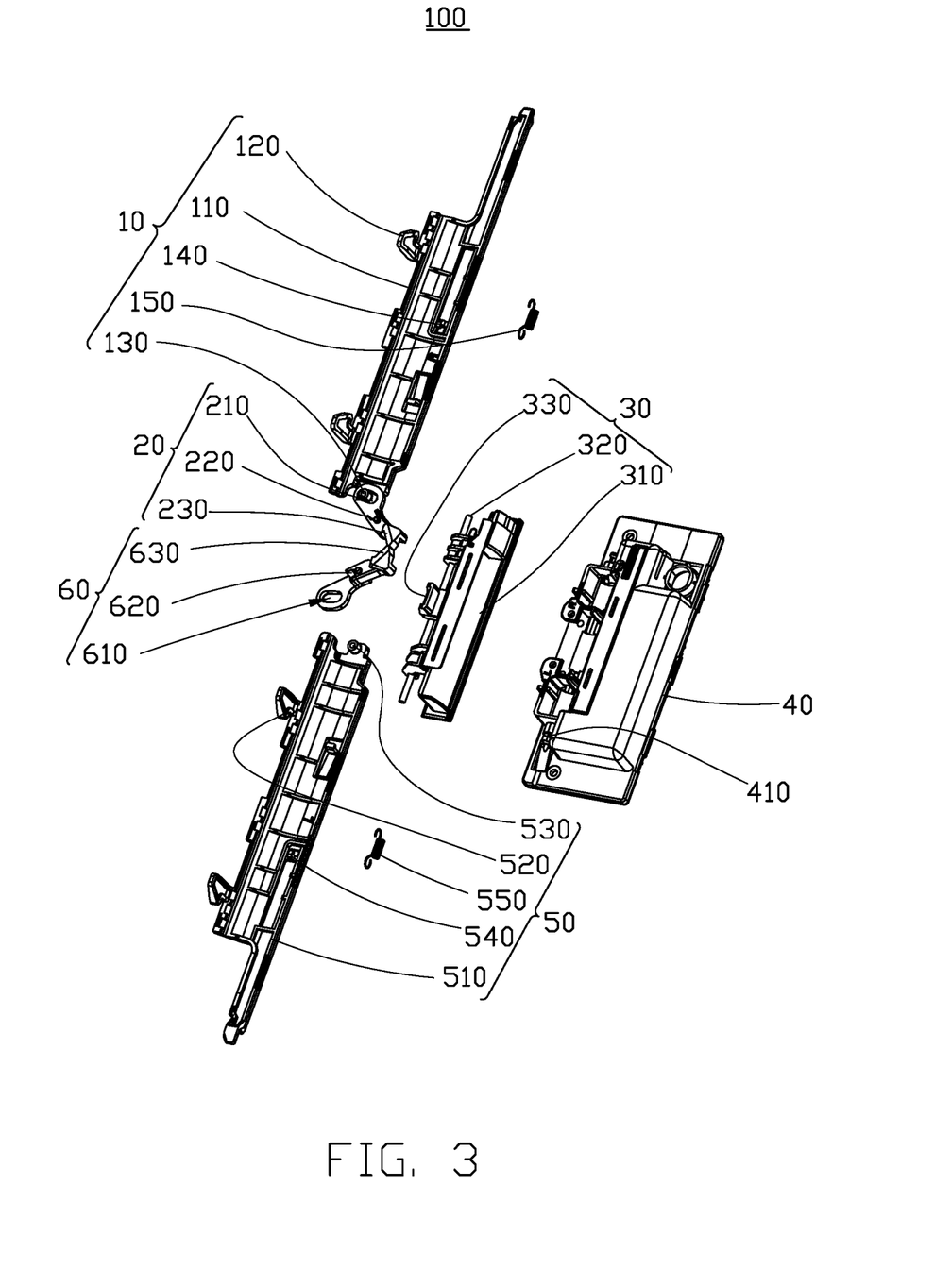
FIG. 3 is an exploded view of the locking device of FIG. 2.

The fixing board 40 defines a second shaft hole 410, and the second shaft hole 410 matches with the pivoting axis 320. The first handle 30 is rotatably connected to the fixing board 40 through the pivoting axis 320 and the second shaft hole 410.

In at least one exemplary embodiment, the locking device 100 may further comprise a second moving lock 50 and a linking rod 60.

The second moving lock 50 has the same structure as the first moving lock 10. The second moving lock 50 and the first moving lock 10 are symmetrically disposed on the sides of the first handle 30.

The linking rod 60 has the same structure as the linking rod 20. The linking rod 60 and the linking rod 20 are symmetrically disposed on the sides of the first handle 30.

The second moving lock 50 may comprise a second moving portion 510, a hook 520, a second sliding portion 530, a second fixing portion 540, and an elastic element 550.

The hook 520 protrudes from the side of the second moving portion 510. The linking rod 60 may drive the second moving portion 510 to move between the locked and the unlocked positions.

The first end of the linking rod 60 defines a second sliding slot 610, and the second sliding slot 610 matches with the second sliding portion 530. The first end of the linking rod 60 is hinged to the second moving portion 510 through the second sliding portion 530 and the second sliding slot 610.

The linking rod 60 may further comprise a second connecting portion 620 and a second hinging portion 630. A first end of the second connecting portion 620 defines the second sliding slot 610, and a second end of the second connecting portion 620 is connected to the second hinging portion 630. The second hinging portion 630 may match with the first driving portion 330.

When the first handle 30 is turned, the first driving portion 330 may drive the second hinging portion 630 to move, and the second hinging portion 630 drives the linking rod 60 to move.

The elastic element 550 connects between the second fixing portion 540 and an external component (not shown in figure).

When the first handle 30 is turned, the first driving portion 330 simultaneously drives the linking rod 20 and the linking rod 60 to move, the linking rod 20 drives the first moving lock 10 to move, and the linking rod 60 drives the second moving lock 50 to move.

Figure 7:
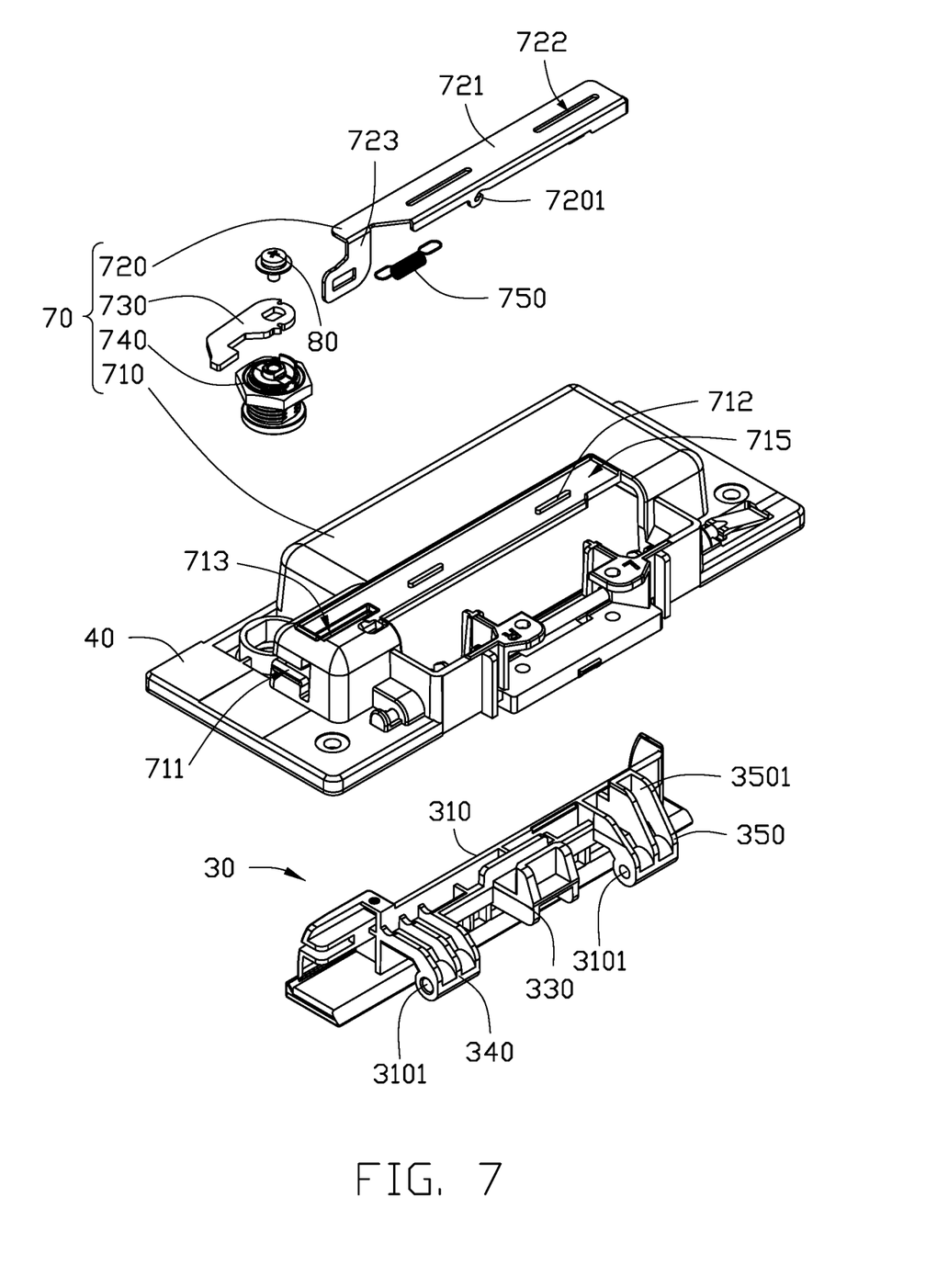
FIG. 7 is an exploded view of a locking assembly of the locking device of FIG. 2.
Figure 8:
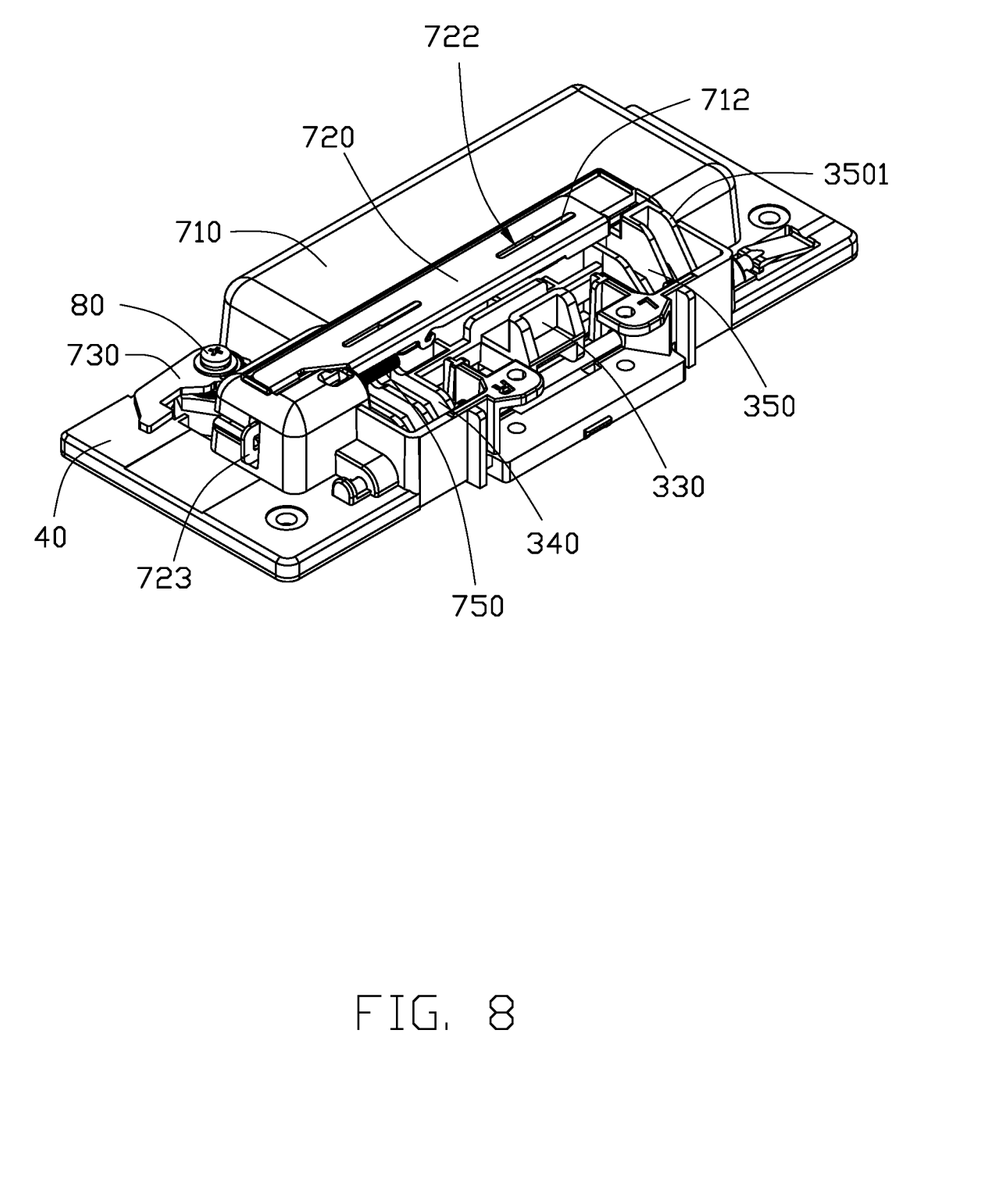
FIG. 8 is an isometric view of the first handle of the locking device of FIG. 2 in a released state.
Figure 9:
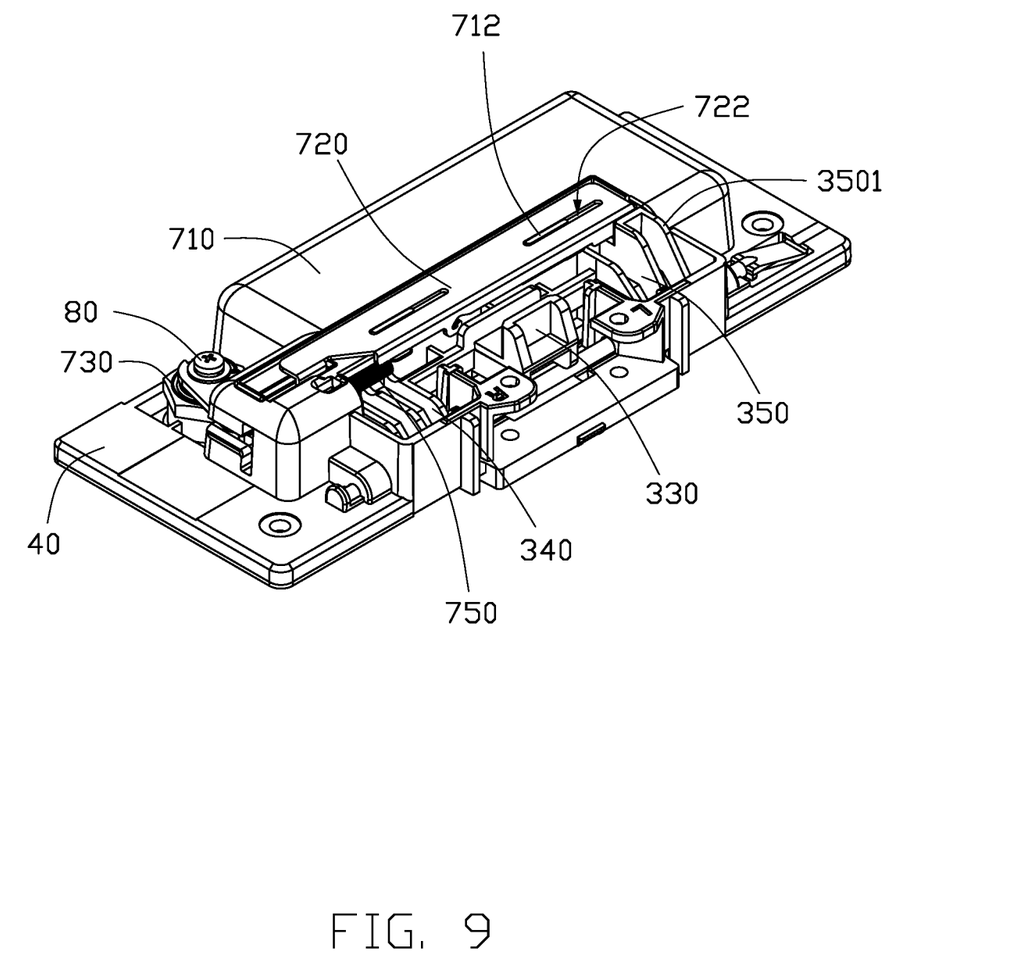
FIG. 9 is an isometric view of the first handle of the locking device of FIG. 2 in a stop state.

Referring to FIGS. 7-9, the locking device 100 may further comprise a locking assembly 70. The locking assembly 70 may comprise a shell 710, a sliding member 720, a second driving portion 730, a second handle 740, and an elastic element 750.

The second handle 740 may pass through a through hole (not shown in figures) on the fixing board 40. A first end of the second handle 740 is located on one side of the fixing board 40, and a second end of the second handle 740 is located on another side of the fixing board 40. A first end of the second driving portion 730 is fixedly connected to the second end of the second handle 740 through a fastening member 80.

The shell 710 is disposed on the fixing board 40. The shell 710 defines a first opening 711, and the first opening 711 may match with the second driving portion 730. Thus, when the first end of the second handle 740 is rotated, the second end of the second handle 740 may drive the second driving portion 730 to move.

The top of the shell 710 defines a sliding groove 715. The shell 710 may further comprise two stopping portions 712, the two stopping portions 712 being disposed in the sliding groove 715.

The sliding groove 715 further defines a second opening 713, the second opening 713 is disposed adjacent to the first opening 711.

The sliding member 720 may match with the first handle 30. The sliding member 720 may further match with the sliding groove 715, and the sliding member 720 may slide in the sliding groove 715.

When the second handle 740 is turned, the second handle 740 may drive the sliding member 720 to move between a stop position and a release position.

In at least one exemplary embodiment, the sliding member 720 may comprise a sliding plate 721. The sliding plate 721 may define two slots 722, the two slots 722 correspond to the stopping portion 712.

One end of the sliding plate 721 also extends downwards to form an extending portion 723, and the extending portion 723 may match with the second opening 713.

When the sliding member 720 is placed in the sliding groove 715, the two stopping portions 712 correspond to the slots 722 and may slide in the two slots 722. The extending portion 723 extends into the second opening 713, and the extending portion 723 may extend from the first opening 711.

In at least one exemplary embodiment, the sliding plate 721 may extend downwards to form a hook 7201. The hook 7201 may be attached to one end of the elastic element 750, and the other end of the elastic element 750 may be attached to the shell 710.

When the first end of the second handle 740 is turned, the second end of the second handle 740 drive the second driving portion 730 to move, and the second driving portion 730 moves in the first opening 711 and drives the extending portion 723 to move. The sliding plate 721 moves toward the stop position, and the elastic element 750 is elastically deformed. Thus, the pressing portion 3501 of the second rotating portion 350 resists against the sliding plate 721, and the first handle 30 may not turn.

When the second handle 740 is released, the elastic element 750 restores itself and drives the sliding plate 721 to the release position. Thus, the pressing portion 3501 will not resist against the sliding plate 721, and the first handle 30 may turn.

The exemplary embodiments shown and described above are only examples. Many details are often found in the art such as the other features of locking devices and chassis. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A locking device comprising:
   a fixing board;
   a first linking rod;
   a first moving lock comprising a first hook, and the first moving lock driving the first hook to move between a locked position and an unlocked position; and
   a first handle rotatably connecting to the fixing board and comprising a first driving portion, a first end of the first linking rod hinging to one end of the first moving lock, and a second end of the first linking rod operatively connecting to the first driving portion;
   wherein when the first handle is turned, the first driving portion drives the first linking rod to move, and the first linking rod drives the first moving lock to move; and
   wherein the locking device further comprises a shell and a sliding member, the shell is connected to the fixing board, the shell defines a sliding groove, the sliding member matches the sliding groove and the first handle, and slides in the sliding groove.

2. The locking device of claim 1, the locking device further comprising:
   a second handle connecting to the fixing board;
   wherein when the second handle is turned, the second handle drives the sliding member to move between a stop position and a release position.

3. The locking device of claim 1, wherein the first moving lock comprises a first moving portion and a first sliding portion, and the first linking rod drives the first moving portion to move between the locked position and the unlocked position; the first end of the first linking rod defines a first sliding slot, the first sliding slot matches the first sliding portion, and the first end of the first linking rod is hinged to the first moving portion through the first sliding portion and the first sliding slot.

4. The locking device of claim 3, wherein the first moving lock further comprises a first elastic element, the first elastic element connects between the first moving portion and an external component; wherein when the first handle is turned, the first moving portion moves toward to the unlocked position, and the first elastic element is elastically deformed; and when the first handle is released, the first elastic element restores itself and drives the first moving portion to return to the locked position.

5. The locking device of claim 3, wherein the first linking rod comprises a first connecting portion and a first hinging portion, a first end of the first connecting portion defines the first sliding slot, a second end of the first connecting portion connects to the first hinging portion, and the first hinging portion matches the first driving portion; and wherein when the first handle is turned, the first driving portion drives the first hinging portion to move, and the first hinging portion drives the first linking rod to move.

6. The locking device of claim 2, wherein the first handle comprises a handing portion, a pivoting axis, a first rotating portion, and a second rotating portion, the first driving portion is located between the first rotating portion and the second rotating portion, the second rotating portion comprises a pressing portion, both the first rotating portion and the second rotating portion defines a first shaft hole, and the first shaft hole matches the pivoting axis; wherein the fixing board defines a second shaft hole, the second shaft hole matches the pivoting axis, and the first handle is rotatably connected to the fixing board through the pivoting axis and the second shaft hole.

7. The locking device of claim 6, wherein the locking device further comprises a second driving portion, and the second driving portion connects to the second handle; the shell defines a first opening, and the first opening matches the second driving portion; the sliding groove defines a second opening, the sliding member comprises a sliding plate, one end of the sliding plate extends downward to form an extending portion, and the extending portion matches the second opening; wherein when the second handle is turned, the second handle drives the second driving portion to move, the second driving portion drives the extending portion to move toward to the stop position.

8. The locking device of claim 7, wherein the locking device further comprises a second elastic element, the sliding plate extends downward to form a second hook, the second hook fixes with a first end of the second elastic element, and a second end of the second elastic element fixes with the shell; wherein when the second handle is released, the second elastic element drives the sliding plate to the release position.

9. The locking device of claim 1, wherein the locking device further comprises a second moving lock and a second linking rod, the second moving lock has the same structure as the first moving lock, and the second moving lock and the first moving lock are symmetrically disposed on the sides of the first handle; the second linking rod has the same structure as the first linking rod, and the second linking rod and the first linking rod are symmetrically disposed on the sides of the first handle.

10. The locking device of claim 9, wherein when the first handle is turned, the first driving portion simultaneously drives the first linking rod and the second linking rod to move, the first linking rod drives the first moving lock to move, and the second linking rod drives the second moving lock to move.

11. A chassis cover comprising:
    a cover body; and
    a locking device installed in the cover body and comprising:
    a fixing board;
    a first linking rod;
    a first moving lock comprising a first hook, and the first moving lock driving the first hook to move between a locked position and an unlocked position; and
    a first handle rotatably connecting to the fixing board and comprising a first driving portion, a first end of the first linking rod hinging to one end of the first moving lock, and a second end of the first linking rod operatively connecting to the first driving portion;

wherein when the first handle is turned, the first driving portion drives the first linking rod to move, and the first linking rod drives the first moving lock to move; and wherein the locking device further comprises a shell and a sliding member, the shell is connected to the fixing board, the shell defines a sliding groove, the sliding member matches the sliding groove and the first handle, and slides in the sliding groove.

12. The chassis cover of claim 11, the locking device further comprising:

a second handle connecting to the fixing board;

wherein when the second handle is turned, the second handle drives the sliding member to move between a stop position and a release position.

13. The chassis cover of claim 11, wherein the first moving lock comprises a first moving portion and a first sliding portion, and the first linking rod drives the first moving portion to move between the locked position and the unlocked position; the first end of the first linking rod defines a first sliding slot, the first sliding slot matches the first sliding portion, and the first end of the first linking rod is hinged to the first moving portion through the first sliding portion and the first sliding slot.

14. The chassis cover of claim 13, wherein the first moving lock further comprises a first elastic element, the first elastic element connects between the first moving portion and an external component; wherein when the first handle is turned, the first moving portion moves toward to the unlocked position, and the first elastic element is elastically deformed; and when the first handle is released, the first elastic element restores itself and drives the first moving portion to return to the locked position.

15. The chassis cover of claim 13, wherein the first linking rod comprises a first connecting portion and a first hinging portion, a first end of the first connecting portion defines the first sliding slot, a second end of the first connecting portion connects to the first hinging portion, and the first hinging portion matches the first driving portion; and wherein when the first handle is turned, the first driving portion drives the first hinging portion to move, and the first hinging portion drives the first linking rod to move.

16. The chassis cover of claim 12, wherein the first handle comprises a handing portion, a pivoting axis, a first rotating portion, and a second rotating portion, the first driving portion is located between the first rotating portion and the second rotating portion, the second rotating portion comprises a pressing portion, both the first rotating portion and the second rotating portion defines a first shaft hole, and the first shaft hole matches the pivoting axis; wherein the fixing board defines a second shaft hole, the second shaft hole matches the pivoting axis, and the first handle is rotatably connected to the fixing board through the pivoting axis and the second shaft hole.

17. The chassis cover of claim 16, wherein the locking device further comprises a second driving portion, and the second driving portion connects to the second handle; the shell defines a first opening, and the first opening matches the second driving portion; the sliding groove defines a second opening, the sliding member comprises a sliding plate, one end of the sliding plate extends downward to form an extending portion, and the extending portion matches the second opening; wherein when the second handle is turned, the second handle drives the second driving portion to move, the second driving portion drives the extending portion to move toward to the stop position.

18. The chassis cover of claim 17, wherein the locking device further comprises a second elastic element, the sliding plate extends downward to form a second hook, the second hook fixes with a first end of the second elastic element, and a second end of the second elastic element fixes with the shell; wherein when the second handle is released, the second elastic element drives the sliding plate to the release position.

19. The chassis cover of claim 11, wherein the locking device further comprises a second moving lock and a second linking rod, the second moving lock has the same structure as the first moving lock, and the second moving lock and the first moving lock are symmetrically disposed on the sides of the first handle; the second linking rod has the same structure as the first linking rod, and the second linking rod and the first linking rod are symmetrically disposed on the sides of the first handle.

20. The chassis cover of claim 19, wherein when the first handle is turned, the first driving portion simultaneously drives the first linking rod and the second linking rod to move, the first linking rod drives the first moving lock to move, and the second linking rod drives the second moving lock to move.

* * * * *